United States Patent

Ramm et al.

[11] Patent Number: 5,384,018
[45] Date of Patent: Jan. 24, 1995

[54] PROCESS AND APPARATUS FOR GENERATING AND IGNITING A LOW-VOLTAGE

[75] Inventors: Jürgen Ramm, Fläsch, Switzerland; Eugen Beck, Fürstentum, Liechtenstein; Hugo Frei, Werdenberg, Switzerland; Albert Zueger, Fürstentum, Liechtenstein; Günter Peter, Plons, Switzerland

[73] Assignee: Balzers Aktiengesellschaft, Balzers, Liechtenstein

[21] Appl. No.: 60,365

[22] Filed: May 11, 1993

[30] Foreign Application Priority Data

May 26, 1992 [CH] Switzerland .................. 1696/92

[51] Int. Cl.⁶ .............................................. C23C 14/34
[52] U.S. Cl. .......................... 204/192.38; 204/298.41; 427/580; 118/723 HC
[58] Field of Search ................. 118/723 HC, 723 R, ; 204/298.41, 192.38; 427/580

[56] References Cited

U.S. PATENT DOCUMENTS

| | | |
|---|---|---|
| 4,123,316 | 10/1978 | Tsuchimoto . |
| 4,346,123 | 8/1982 | Kaufmann . |
| 4,877,505 | 10/1989 | Borgmann ...................... 204/192.38 |
| 5,113,790 | 5/1992 | Geisler et al. . |
| 5,192,578 | 3/1993 | Ramm et al. ................... 427/580 X |
| 5,250,779 | 10/1993 | Kaufmann et al. ........ 204/192.38 X |

FOREIGN PATENT DOCUMENTS

| | | |
|---|---|---|
| 1589160 | 5/1978 | European Pat. Off. . |
| 0484704 | 10/1991 | European Pat. Off. . |
| 0070982 | 12/1982 | United Kingdom . |

Primary Examiner—R. Bruce Breneman
Assistant Examiner—Jonathan D. Baskin
Attorney, Agent, or Firm—Notaro & Michalos

[57] ABSTRACT

A cathode chamber (1) with a thermionic cathode (3) generates a low-voltage arc discharge in a vacuum treatment chamber (11). Arcing on wall portions of the treatment chamber (11) is prevented by providing a screen (20), operated so as to be electrically floating, in the region of a diaphragm (9), through which diaphragm (9) the discharge is drawn from the cathode chamber (1) into the treatment chamber (11). The discharge is ignited by impressing portions of the cathode chamber wall with the ignition potential, with respect to the potential of the cathode (3).

38 Claims, 7 Drawing Sheets

PROCESS AND APPARATUS FOR GENERATING AND IGNITING A LOW-VOLTAGE

FIELD AND BACKGROUND OF THE INVENTION

The present invention relates to a process for generating a low-voltage discharge, a process for igniting and operating the low-voltage discharge, a vacuum treatment apparatus with a treatment chamber, a cathode chamber for generating a low-voltage discharge and methods of using the apparatus.

It is known to use low-voltage arc discharges for various vacuum treatment processes. For example see Swiss Patent CHP 456,294 or CHP 551,497, and further CHP 645,137. Also see, "Ein Produktionsverfahren zur Herstellung dünner Schichten durch Kathodenzerstäubung im Hochvacuumbereich" {"A production process for the production of thin layers by cathode sputtering in the high-vacuum zone"}, Rudolf A. Lang Verlag, Wiesbaden, No. 7/66, pp. 161-164, or "Ein Verfahren zur Herstellung dünner Schichten durch Ionenzerstäubung im 10E-4 Toor Bereich" {"A process for the production of thin layers by ion sputtering in the 10E-4 Torrs range"}, F. P. Gaydou, Blazers Aktiengesellschaft, FL-Balzers, in reprints from Mikroelektronik 2, Oldenburg/MünchenVienna 1967, pp. 183-192. From these references, it is known to generating a low-voltage arc discharge in a vacuum treatment chamber, and to couple a cathode chamber via a diaphragm to the latter, with a thermionic cathode in the cathode chamber. The low-voltage arc discharge is customarily ignited with the aid of a separate ignition electrode which is placed at a positive anodic ignition potential with respect to the thermionic cathode.

After the ignition of the low-voltage discharge in the cathode chamber, the discharge is primarily maintained between the thermionic cathode and an anode disposed in the treatment chamber. The anode provided in the treatment chamber can be formed by at least part of the inner wall of the treatment chamber, or a separate anode arrangement can be disposed in the treatment chamber so as to be electrically insulated from the wall of the treatment chamber in such a way that the treatment chamber and the stated anode arrangement can be operated at a potential which is electrically separated. An anode arrangement of this type can be formed for example by a substrate carrier in the treatment chamber.

In particular apparatuses, such as are known for example from CHP 551,497, the diaphragm arrangement is operated electrically at floating potential, in other applications, such as are known for example from CHP 456,294, it is at the potential of the wall of the treatment chamber.

It has been found that in an arrangement of this type, arc discharges which are known under the term "arcing", develop in particular on portions of the inner wall of the treatment chamber, and specifically more strongly the more such portions are exposed to the discharge and the higher the electrical field strength is at such portions.

Arcing of this type places stress on the electrical feed apparatus which is provided for maintaining the discharge, and has other undesirable effects such as uncontrolled process behavior such as underbreaks and contamination, for example, through gas eruptions, sputtering-off or vaporization of materials not desired, etc. An implementation of the process can become entirely impossible under these conditions. A sputtering-off of the wall portions affected by the arcing in the case of delicate treatment processes in which an extremely pure and controlled treatment atmosphere is required, leads to intolerable contamination, for example.

SUMMARY OF THE INVENTION

These problems lead to the fact that the stated treatment processes with low-voltage arc discharge, which per se would be advantageous for some processes due to the low kinetic energy of the charge carriers in the low-voltage arc discharge with simultaneous high charge carrier density, have not been used for some treatment processes in which the stated contamination is not acceptable.

A main aspect of the present invention is to solve these problems, in other words, to improve processes with low-voltage arc discharge, consequently a low-voltage high-current discharge, in such a way that they can also be used for treatment processes which make high demands on the treatment atmosphere.

The process of the invention is distinguished from the prior art in that the invention uses a screen at floating electrical potential around a diaphragm arrangement of the cathode chamber, to avoid arcing at the diaphragm arrangement.

It was found that the portions of the inner wall of the treatment chamber most frequently exposed to arcing are disposed about the diaphragm arrangement. Providing the screen according to the invention prevents the occurrence of the stated arcing in this region. Consequently, it is now possible to use such a process where extremely high requirements on the treatment atmosphere must be met.

The above stated problems with respect to arcing in known processes, occur in the case of portions which are operated at floating potential to the diaphragm arrangement, as well as also (and this to a more pronounced degree) if the stated portions are operated at fixed potential.

Due to the invention, however, it is possible to operate portions around the diaphragm arrangement at fixed potential. This is extremely advantageous with respect to the flexibility of the electrical connections or potential connection of the cathode chamber, the treatment chamber and portions around the diaphragm arrangement.

It is in particular made possible, according to the invention, to operate the stated portions with or about the diaphragm arrangement as the ignition electrode for the low-voltage discharge. To this end the portions are connected to different electrical potentials for a time and for the purpose of ignition during the operation of the low-voltage discharge. This results in the advantage that an ignition electrode in the cathode chamber does not need to be additionally provided and be electrically insulated through the electrode chamber wall, but rather that elements provided anyway, namely the stated portions of the diaphragm arrangement, can simultaneously also be used as the ignition electrode.

In this way an extremely simple embodiment of the invention allows the stated portions to be placed at a fixed potential via a passive current limitation switching element, such as a simple resistor, or potentially also via a diode. A portion of the discharge current during the discharge operation effects a voltage drop thereon in such a way that the stated portions, during the operation of the low-voltage discharge, are brought to a more negative potential with respect to their ignition potential. It should be stated here that the term "potential" is used in the sense of field theory, and is consequently referenceless (reference→∞).

It is also possible, however, following another feature of the invention, as a supplement to the stated passive switching element or in place of it, to connect the stated portions as an ignition electrode to a fixed potential via a current-driven voltage source.

In particular in the case of the specific connection of the stated portions to predetermined electrical potentials it is, furthermore, advantageous to be able to realize this independently of the manner in which the treatment chamber wall is connected or carried in terms of potential.

To this end, according to another feature of the invention, it is suggested to electrically insulate the stated portions, from the wall of the treatment chamber.

Further the stated portions are preferably formed by the cathode chamber wall. This opens the possibility of using, as the ignition electrode, the portions forming the diaphragm arrangement and enclosing the at least one diaphragm opening proper, which is included in the diaphragm arrangement.

In the case of mounting the treatment chamber in a manner which is insulated from the stated portions, the latter are preferably operated at different electrical potentials with respect to the treatment chamber inner wall. Therewith it is made possible to draw the main discharge after its ignition through the diaphragm arrangement into the treatment chamber even if the stated portions have previously been connected as the ignition electrode.

In a further preferred embodiment, the cathode chamber and treatment chamber are operated at different operating pressures, and the diaphragm arrangement is simultaneously implemented as a pressure stage between the stated chambers. In this way it is possible to build up a higher operating pressure, in particular at the cathode chamber side, in order to allow the gas flow to stream through the diaphragm arrangement during the discharge operation and to do this according to the pressure stage effect of the diaphragm arrangement.

In order to achieve the best possible pressure decoupling between the cathode chamber and the treatment chamber, according to another feature of the invention, it is further suggested to provide at the cathode chamber side and/or the treatment chamber side, a pipe socket as a flow resistance, at the opening of the diaphragm arrangement whereby its pressure stage effect is increased.

In order to decouple the cathode chamber and treatment chamber in terms of pressure it is further suggested to use two diaphragm arrangements with a suctioning-off connection therebetween.

In a further preferred embodiment, the screen provided according to the invention is carried up to the point directly around the at least one opening of the diaphragm arrangement and this screen can be carried further as a pipe socket in order to increase the stated pressure stage effect. Providing the stated pipe socket is carried out, in particular, also in the case of the differential pumping or suctioning-off step.

It was found that enclosing the stated portions, even at a distance from the at least one opening of the diaphragm arrangement, already yields a very significant improvement with respect to arcing at the inner wall of the treatment chamber.

Under the second aspect of the present invention (ignition), which, as will readily be seen, can be combined in an optimal manner with the measures under the first aspect (anti-arcing), a process for igniting and operating a low-voltage discharge of the stated type is suggested which is distinguished by using a current limiting element such as a resistor connected to the cathode.

In principle, it is thus made possible that at the cathode chamber no ignition electrode specifically provided for this purpose needs to be installed, and further, that the portion of the cathode chamber inner wall now acting as the ignition electrode is at a fixed potential via a passive switching element. This avoids, in a simple way, the need for the ignition voltage to be connected to the ignition electrode with the aid of a controllable voltage source, controllable in order to be able, after the ignition of the discharge, to maintain the discharge primarily between the thermionic cathode and an operating anode disposed at any desired site, e.g. in the treatment chamber.

A vacuum treatment apparatus or installation which solves the task under the first aspect of the present invention is also provided.

Under the second aspect, optimally combinable, as stated, with the first, a cathode chamber, according to other features of the invention, is also suggested.

As has been stated, due to the approach according to the invention the possibility is given of using the process or the vacuum treatment installation of the stated class according to the invention for special delicate treatment processes and, in particular, for the treatment of work pieces in the treatment chamber with monopolar charge carriers drawn electrostatically and/or electrodynamically from the discharge in the treatment chamber, such as in particular for electron-stimulated chemical reactions on work pieces at high electron density and low electron energy or for low-temperature work piece treatment processes in the treatment chamber and/or layer growth processes on work pieces in the treatment chamber, such as for homo- and heteroepitaxial coating processes.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the following the invention will be explained by example in conjunction with the drawings wherein.

DESCRIPTION OF THE PREFERRED EMBODIMENTS

Figure 1:
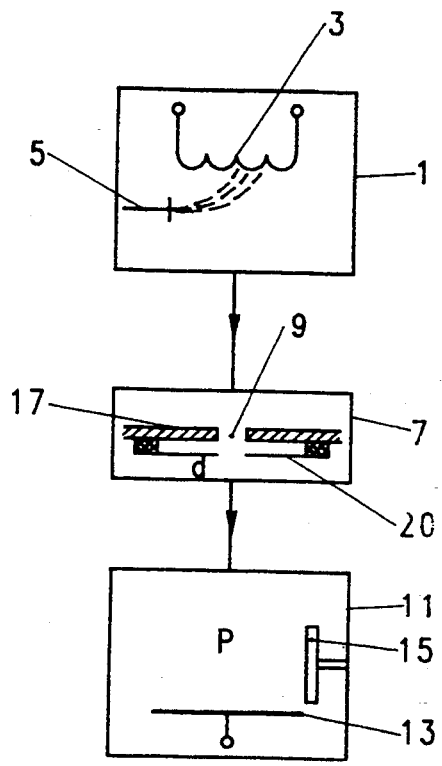
FIG. 1 is a schematic circuit diagram showing the principle of a vacuum treatment installation according to the invention and the process according to the invention.

FIG. 1 depicts, in principle, the present invention in its first aspect and in the form of a function block diagram.

In a cathode chamber 1 with a thermionic cathode 3 a low-voltage arc discharge is ignited by means of an ignition anode 5. After its ignition the low-voltage arc discharge is drawn into a vacuum treatment chamber 11 through a diaphragm arrangement 7 with at least one diaphragm opening 9 therein. This takes place with the aid of a main anode 13, with respect to the thermionic cathode 3, at a corresponding positive anodic potential.

One or several work pieces 15 are provided in the vacuum treatment chamber 11, depending on the process carried out, and are either at a floating or a fixed potential. Gas inlets as well as electrical feed and pump aggregates to the cathode chamber 1 or the treatment chamber 11 or between the aggregates at the cathode chamber side or treatment chamber side acting electrically as electrodes normally used with the apparatus, are not shown in FIG. 1.

The invention resides in providing wall portions 17 which surround or encompass the at least one diaphragm opening 9, and which are exposed toward the treatment chamber 11, with a screen 20 which encompasses or surrounds the at least one opening 9 of the diaphragm arrangement at least largely, consequently if at all, with only minor interruptions and which, with respect of the wall areas of portions 17 facing the treatment chamber 11, is kept at the so-called dark space distance d, from portions 17. The screen 20 can therein encircle the stated opening 9 at a relatively great distance, but can also, as will be explained, extend into the immediate vicinity of the opening region.

By providing screen 20, according to the invention, the arcing on the stated wall areas is largely prevented and, consequently is prevented on those portions of the surfaces exposed to the process region P in the treatment chamber 11 which are most subject to arcing in the prior art.

Figure 2:
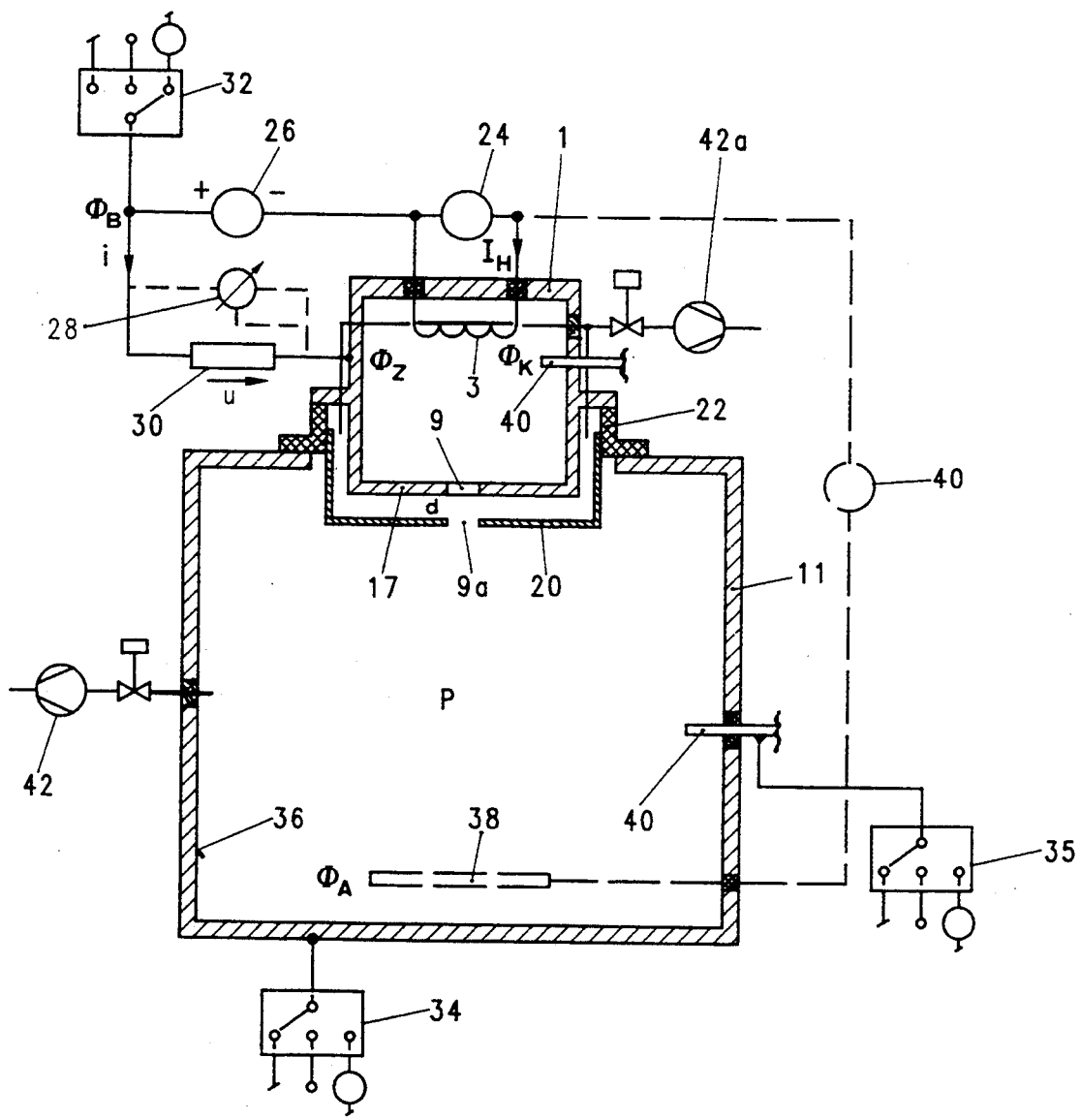
FIG. 2 is a schematic diagram of a preferred embodiment of a vacuum treatment apparatus or installation according to the invention with a cathode chamber according to the invention, also for the explanation of the process according to the invention.

FIG. 2 schematically depicts a first preferred embodiment of an installation or apparatus according to the invention. Units corresponding to those already explained in conjunction with FIG. 1 are denoted by the same reference symbols.

Portions or parts 17 which surround the diaphragm arrangement or are at its at least one opening 9, are part of the cathode chamber wall in this embodiment. Cathode chamber 1 is mounted on the wall of the treatment chamber 11 via electrically insulating support 22. Here the screen 20, operated at a floating potential with respect to cathode chamber 1 as well as also with respect to the treatment chamber 11, encloses the stated portions 17 at the dark space distance d into the immediate vicinity of the region of the diaphragm opening 9. Screen 20 is a floating potential since it is connected to insulating support 22 only.

The thermionic cathode 3 is operated by means of a power source 24, at a heating current $I_H$ and is carried via a voltage source 26 and, generally speaking, a unit 28 connected to at least a part of the cathode chamber wall, preferably to the cathode chamber wall per se. Unit 28 acts as a current limitation element and brings about a voltage drop u as a function of the current i flowing through it. As shown in dashed lines, it can be realized by a current-controlled voltage source, but is realized preferably by a passive switching element, in particular by a resistor element 30.

The negative terminal of the voltage source 26 can be connected to a reference potential, be this ground or a further given potential, or it can be operated potential-free as is depicted purely schematically by the option switch 32. Analogously, since insulated from the cathode chamber 1, the treatment chamber 11, as shown purely schematically with the option switch 34, can be operated at a reference potential or, if desired, even at a floating potential. Depending on the process to be carried out in process chamber P, the treatment chamber inner wall 36 or at least portions thereof are connected as the anode with respect to the thermionic cathode 3 so that the discharge develops primarily between the stated cathode 3 and the stated inner wall portions.

Otherwise, as shown in dashed lines, a separate anode 38 is provided, which, via a voltage source 48, is connected anodically, i.e. positively, with respect to the thermionic cathode 3. In that case, freedom of choice is given with respect to the potential connection of the treatment chamber in terms of process adaptation. Since the anode can serve any part in chamber 11, in particular it can also be a work piece carrier.

An ionization gas for the low-voltage discharge is supplied via gas feed lines 40 to the cathode chamber 1 and/or the treatment chamber 11. Potentially, to the cathode chamber 1 and/or the treatment chamber 11 may also receive a reactive gas, the latter preferably to the treatment chamber 11, which in known manner, reacts chemically in the flow discharge with the matter particles, such as vaporized or etched-off particles, participating in the process, within a reactive etching or coating process.

As again depicted schematically at 35, the gas feed line 40 can be operated in an uncoupled manner from the potential of the chamber wall, at ground potential, at another potential or free of potential in order to generate specifically additional excitation or ionization effects.

In the following the treatment chamber 11 is operated by means of a pump aggregate 42 for establishing the vacuum.

The diaphragm arrangement with the at least one diaphragm opening 9 acts additionally as a pressure stage between the pressure in the cathode chamber 1 and the pressure in the treatment chamber 11. Depending on the implementation of its pressure decoupling effect, the two chambers can be operated essentially pressure-independently of one another. Therewith for example the partial pressure of a reactive gas can be kept significantly higher in the treatment chamber 11 than in the cathode chamber 1, wherein a gas of this type could for example react on the cathode 3 and could reduce drastically its operating life. Conversely, the partial pressure of background gases, such as for example of Ar in the treatment chamber 11 can be maintained significantly lower than in the cathode chamber 1 where this gas is necessary for the generation of the discharge.

As depicted in FIG. 2, the screen 20 is in the immediate vicinity of the region of the diaphragm opening 9 and forms an interspace with parts of the cathode chamber wall. Opening 9a in screen 20 simultaneously forms a further diaphragm. Therefore by pumping in the stated interspace in this arrangement, differential pumping can be realized as shown at 42a which is connected both to chamber 1 and to the space d, whereby a further improvement of the pressure decoupling is realized.

Figure 10:
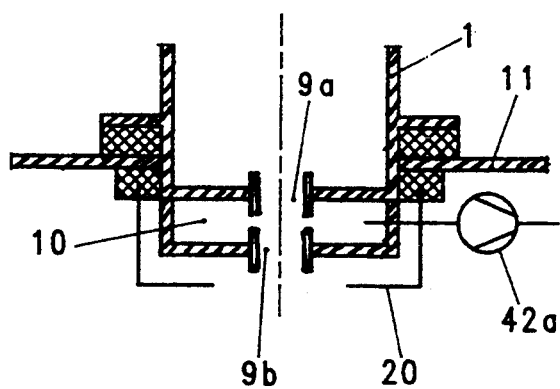
FIG. 10 is a schematically shown segment from an installation according to FIG. 2, in which the diaphragm arrangement is implemented with two pressure stages and pumping between the pressure stages takes place differentially.

FIG. 10 depicts a segment of a further implementation of the diaphragm arrangement region on the installation according to FIG. 2, where the diaphragm arrangement itself is implemented doubly and differential pumping is carried out in the interspace 10 formed in this way. Pipe sockets according to FIG. 10 preferably provided at the diaphragm openings 9a or 9b, will be discussed in further detail in connection with FIGS. 4a to 4e.

In the embodiment depicted in FIG. 2 the cathode chamber is implemented in a manner inventive per se, as will still be explained. This is not required for the realization of the invention under its first aspect, namely prevention of arcing, i.e. it is independent of providing the screen 20, but is preferably combined with it.

In this cathode chamber 1 according to the invention, at least a part of its inner wall is used as the ignition electrode and this preferably in the manner depicted in FIG. 2.

The function of the ignition realized thereby will be explained in conjunction with FIG. 5.

Figure 5:
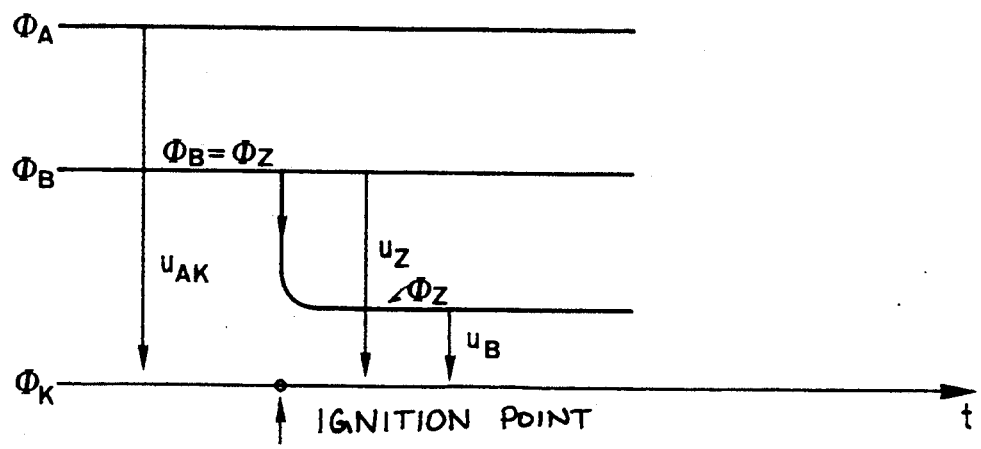
FIG. 5 is a graph plotting electrical potentials over time t in a cathode chamber according to the invention, as used in the installation according to FIG. 2, and also for the explanation of the ignition process according to the invention.

In FIG. 5, the following are plotted qualitatively over time t:

$\phi_B$ the negative potential of the source 26 according to FIG. 2, $\phi_A$ the potential of a discharge anode provided in the treatment chamber, e.g. 38 according to FIG. 2 or at least as parts of the treatment chamber inner wall 36, $\phi_Z$ the potential of at least that part of the cathode chamber inner wall which is used as the ignition electrode, $\phi_K$ the potential of the thermionic cathode 3, corresponding to the negative terminal of source 26, which is used as the reference potential in FIG. 5.

For igniting the low-voltage discharge first the thermionic cathode 3 is heated with the heating current $I_H$ for the purpose of electron emission. At least one ionization gas, such as for example argon, is fed through line 40 into the cathode chamber 1 either via treatment chamber 11 or more conventionally, directly.

In the example depicted in FIG. 2 the entire wall of the cathode chamber 1 is connected to a positive potential with respect to the thermionic cathode 3, whereby between the thermionic cathode 3 and the wall of the cathode chamber 1, the ignition voltage $U_z$ according to FIG. 5 develops before the ignition of the discharge.

Due to the electrical field resulting from the distance between the wall and the cathode, the ignition of the discharge takes place whereupon, with respect to the electron stream in the opposite direction (current direction convention), a current i corresponding to a discharge current component flows through the unit 28 and, in particular in the preferred embodiment, through the resistor element 30. Potential $\phi_Z$ of the wall of the cathode chamber 1 decreases whereby, according to FIG. 5, during the discharge operation between the wall of the cathode chamber 1 and the cathode 3 a significantly reduced voltage $U_B$ results.

During operation, the wall of chamber 1, consequently, acts only to a negligible degree as the anode. The primary discharge is maintained through the diaphragm arrangement and its opening 9, between the cathode 3 and the anode in the treatment chamber.

In order to be able to realize this simple approach at least the part of the cathode chamber wall used as the ignition electrode must be separated from the potential of the treatment chamber wall if the latter, as is preferred, is used as the anode at the treatment chamber side. If therein in simple manner, the entire wall of the cathode chamber, and consequently also portions 17, are used as the ignition electrode, these portions 17 remain cathodic after the ignition, as shown in FIG. 5, whereby this simple approach can be realized in particular for delicate processes only by providing, also according to the invention, the screen 20 to stop the danger of arcing.

Figure 3:
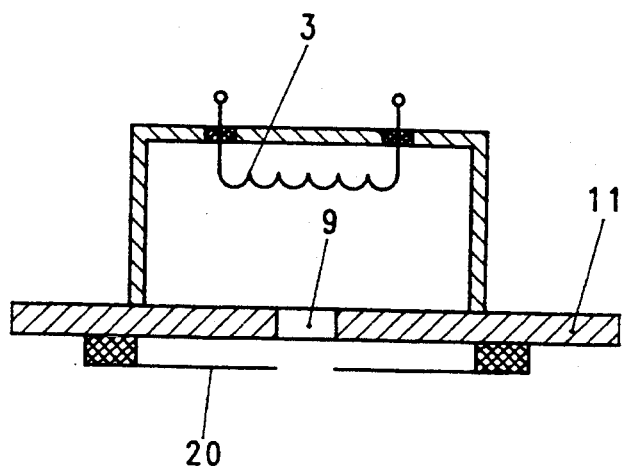
FIG. 3 is a schematic diagram of a segment of the transition from cathode chamber to treatment chamber according to FIG. 2, in a further embodiment of the invention.

FIG. 3 depicts the first aspect of the invention where the diaphragm arrangement with its at least one opening 9 can also be formed by the wall of the treatment chamber 11.

FIGS. 4a to 4e illustrate further partially preferred embodiments as segments of FIG. 2 around the diaphragm arrangement.

Figure 4A:
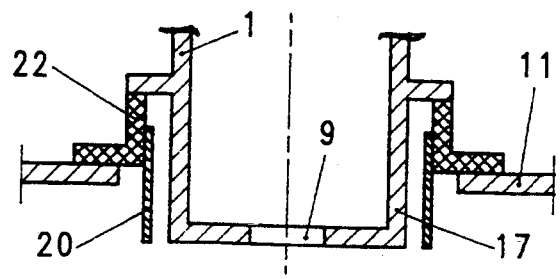
FIGS. 4a–4e are sectional views of segments of the transition between cathode chamber and treatment chamber according to FIG. 2, in further embodiments.

According to FIG. 4a the screen 20 on the arrangement according to FIG. 2 is not drawn into the close vicinity of the at least one opening 9 of the diaphragm arrangement but rather is looped around portions 17 at a distance from the opening 9 of the diaphragm arrangement. Thereby a substantial reduction of the arcing is already achieved and specifically, as for example when using the cathode chamber according to the invention, the latter with respect to the treatment chamber wall, is operated at a different potential, for example if the latter is used as anode.

As has been mentioned, it is extremely advantageous that with the diaphragm arrangement a pressure stage between cathode chamber and treatment chamber is realized. This effect can be reinforced according to FIGS. 4b to 4d in that on the at least one diaphragm opening 9 at the cathode chamber side and treatment chamber side according to FIG. 4b, a one-piece pipe socket $44_K$ or $44_B$ each is provided or, according to FIG. 4c, only at the cathode chamber side the socket $44_K$ or, according to FIG. 4b, only at the treatment chamber side the socket $44_B$ is provided.

Figure 4B:
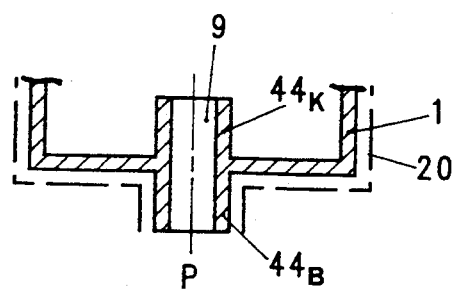
Figure 4C:
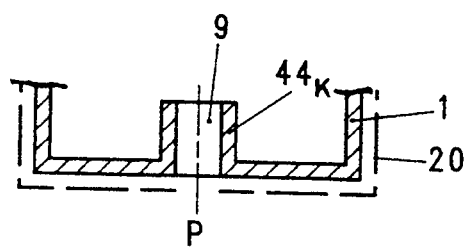
Figure 4D:
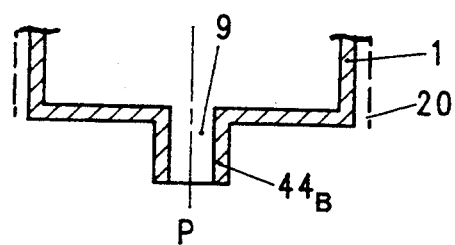

The screens 20 according to the invention are drawn in dashed lines in FIGS. 4b to 4d.

Figure 4E:
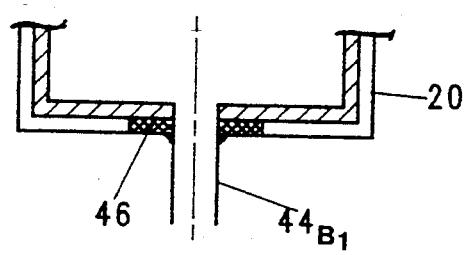

According to FIG. 4e the socket $44_{B1}$ is formed by the screen 20. It is consequently at a floating potential for which, as shown schematically, potentially additional insulating supports 46 are provided.

According to the process of the invention, or with the vacuum treatment installation according to the invention, a low-voltage high-current gas discharge is used or generated. This process is extremely well suited for applications in which the material removal on a surface is to be carried out in the treatment chamber. Using this process, either work pieces can be cleaned on their surface, or the inner wall of the vacuum chamber 11 according to FIG. 2, can be cleaned. It has therein been found that a reactive removal process, for example for the removal of impurities comprising oxide, carbon and also carbon compounds, with the aid of hydrogen gas as the reactive gas, yields extraordinarily good results. Therefore in this use of the process according to the invention or the corresponding installation, in the case of the installation of FIG. 2, hydrogen gas is introduced into the treatment chamber 11 and activated in the low-voltage arc discharge. The removal process realized thereby makes possible the cleaning of surfaces on which subsequently adhesive layers of extremely high purity can be deposited. Therein a high removal rate results which means a high economy of the process.

Due to the high currents of the low-voltage discharge, depending on their bundling, an electron beam occurs on the recipient wall which can yield local heating up to, for example, 400° C., which in some cases is not permissible. If the electron beam, for example when cleaning the recipient inner wall, does not impinge on the wall, but, for cleaning of a substrate surface impinges on the substrate, it is understood, that the stated temperature loading is also impermissible in many cases. Substrate temperatures which inter alia are a function of the process time, frequently cannot be higher than 110° C., which is often already reached after a few minutes. Subsequently, the electron beam is deflected by the residual magnetic fields of the installation and environment as well as by the earth's magnetic field. Consequently, electron orbits and therewith a beam impingement region result, which are a function of the local installation orientation in the room.

Furthermore, in the surface treatment of substrates frequently and, in particular, with relatively bundled plasma of the low-voltage arc discharge an inhomogeneous working effect, such as for example an inhomogeneous removal rate, results in the sense that in one region of the work piece or substrate more is removed than in another and this occurs in a relatively uncontrolled manner.

All of these problems which result through the high values of the discharge current of for example 90 amperes at 40 volts, can largely be solved by applying a magnetic field in the treatment chamber which is constant in time and/or variable in time.

In order to prevent that during the cleaning of the recipient wall or of a substrate too high a local heating occurs, the electrons of the low-voltage discharge plasma are deflected by means of a magnetic field, i.e. the region to be cleaned is wiped off or the electron beam is operated with the aid of the magnetic field so as to be locally oscillating, i.e. it is wobbled. Therewith along the cleaned surface a temperature compensation results.

Figure 8:
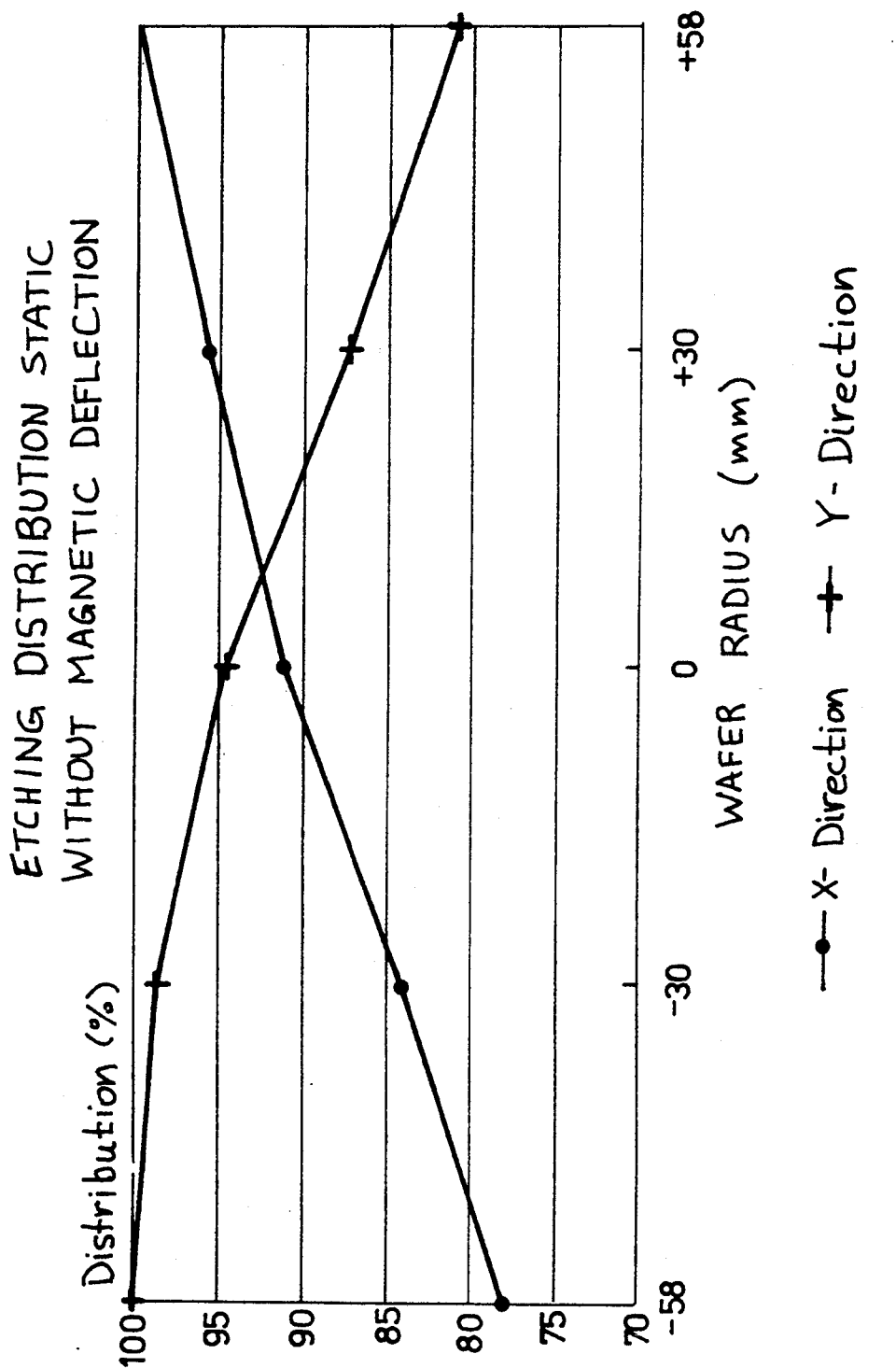
FIG. 8 is a graph showing an etching distribution in percent over the radius of a wafer etched according to the process of the invention, or by means of a treatment installation according to the invention without magnetic deflection.
Figure 9:
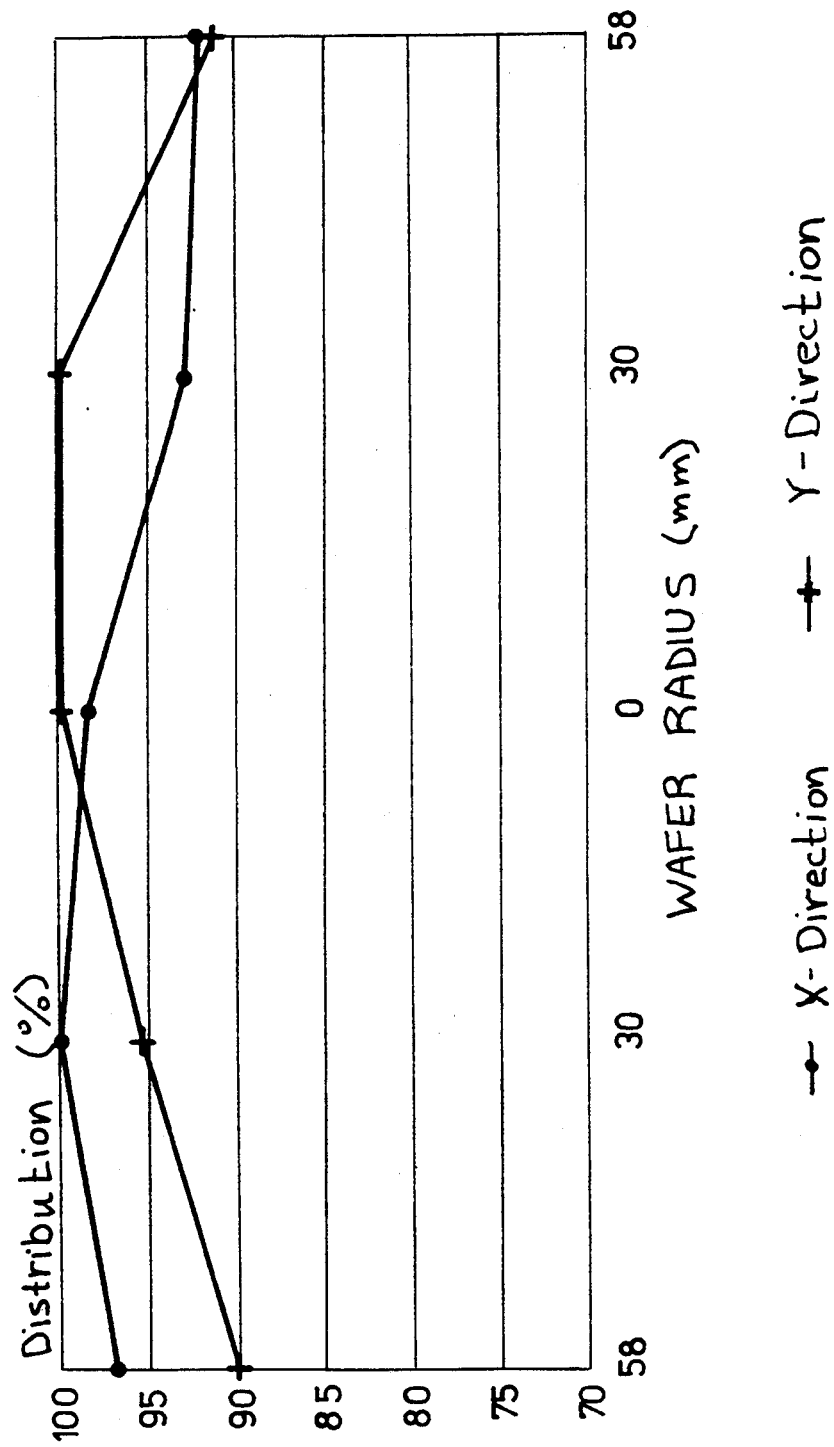
FIG. 9 is a graph similar to FIG. 8 but with magnetic deflection.

Influences of the earth's magnetic field and of residual magnetic fields on the orbit of the electron, after an installation has been set up at its destination site, is compensated with the aid of compensating magnetic fields on the treatment chamber. An inhomogeneous effect distribution of the low-voltage discharge on a substrate to be worked, in particular on a substrate to be etched, for example to be etched for the purpose of cleaning, is also at least partially eliminated by applying orbit-correcting magnetic fields, wherein with the stated magnetic fields the electron beam can also be spread. The difference between an etching process with and without magnetic deflection in an installation according to FIG. 2 is illustrated in FIGS. 8 and 9.

The etching profile can be magnetically controlled.

Moreover, by applying a magnetic field the plasma density is increased. Thus, in the region of a substrate to be etched, the removal rate is increased through the local increase of the plasma density. This without the kinetic energy of impinging particles being increased. Consequently, so has the etching rate has been increased, the working time has been reduced and, consequently, the thermal loading of the substrate.

Figure 6:
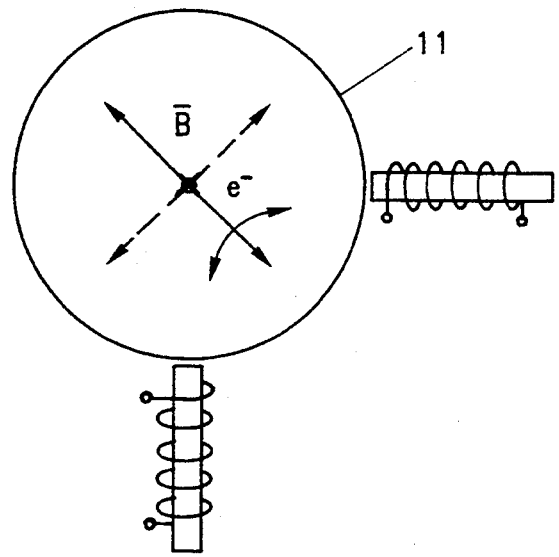
FIG. 6 is a schematic top view onto a vacuum treatment installation according to the invention with magnetic field sources for the controlled influence of the plasma diffusion and in particular the electron orbits in the treatment chamber.

FIG. 6 depicts purely schematically the treatment chamber 11 according to FIG. 2, with a schematically depicted electron orbit e. By applying the magnetic field B the orbit e, as entered in dashed lines, is deflected. The generation of the magnetic field B takes place by means of permanent magnets or, as shown, by means of electromagnets which are provided as a pair or, in the sense of a quadruple, as a double pair along the wall of the treatment chamber and are set for optimizing the electron orbits or the electron beams.

Figure 7:
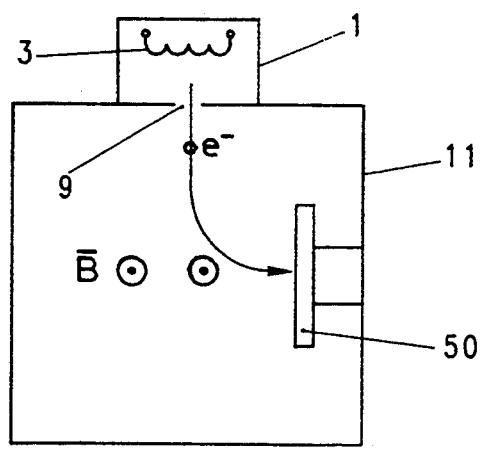
FIG. 7 is a view of an apparatus analogous to that of FIG. 2, represented schematically, in which a work piece carrier is disposed out of sight with respect to the thermionic cathode and the electrons of the discharge are deflected by a magnetic field, against the work piece carrier or the work pieces.

According to FIG. 7, which schematically shows in longitudinal section the installation according to FIG. 2, a work piece carrier 50 is disposed in the treatment chamber 11 in such a way that it is without visual contact, that is not in the line of sight of the thermionic cathode 3. This has the significant advantage that interfering reciprocal effects of cathode and work piece are prevented. Electron beam e is deflected by means of the magnetic field B after exiting from the diaphragm 9, against the work piece carrier 50 or the work pieces thereon.

Consequently by applying magnetic fields the course and/or the spreading of the electron beam in the low-voltage discharge plasma can be specifically set.

Looking back on the installation according to FIG. 2 further a resistance value for the resistor element 30 of 22 ohms was used which, with a total discharge current of 10 to 20 amperes and a cathode/anode voltage of 25 volts, led to a current of 1 ampere through said resistor. Furthermore, it must be stated that the detected strong influence of the stated magnetic fields and, consequently, the good controllability of the electron orbits, is essentially brought about so that the kinetic energy of the electrons is low due to the low-voltage discharge used.

The installation according to the invention or the approach according to the invention, in particular under its first aspect, provides the possibility of using low-voltage discharges for highly difficult and complicated applications, such as for example for semiconductor production in which process gas partial pressures of typically less than $10^{-9}$ mbars must be used. But the approach entails already at significantly higher total process pressures beginning with $10^{-1}$ mbars significant advantages with respect to the stated arcing.

If the approach according to the invention is used for high-vacuum or even ultra high-vacuum applications, it is understood that the insulating or sealing connections of the parts to be provided in principle in FIG. 2, are implemented in the techniques customarily used in the particular vacuum ranges. Especially in treatment processes in which extremely low partial pressures of the involved process gases or working gases must be ensured, the further development of the diaphragm arrangement to form the pressure stages according to FIGS. 4b to 4e or FIG. 10 has been found to be extremely well suitable.

Therewith the stated low-voltage arc discharges can be used for highly difficult processes, such as in particular for the treatment of work pieces with monopolar charge carriers drawn electrostatically from the discharge in the treatment chamber, such as for chemical reactions stimulated by electrons on the work pieces at high electron density and low electron energy. In particular this invention is useful for low-temperature treatment processes, and layer growth processes on the work pieces, such as for homo-and hetero epitaxial coating processes.

While specific embodiments of the invention have been shown and described in detail to illustrate the application of the principles of the invention, it will be understood that the invention may be embodied otherwise without departing from such principles.

What is claimed is:

1. A process for generating a low-voltage discharge between at least one thermionic cathode (3) in a cathode chamber (1) and an anode (36, 38) in a vacuum treatment chamber (11) which is connected to the cathode chamber (1) via a diaphragm arrangement (7, 9) having at least one opening therein and portions (17) bordering an interior of the vacuum treatment chamber, the process comprising:
    operating the low-voltage discharge between the cathode and the anode;
    providing a screen (20) which is maintained at a dark space distance from and over at least part of the portions (17) of the diaphragm arrangement; and
    operating the screen at electrically floating potential so that arc discharging onto the portions (17) is at least essentially prevented.

2. A process according to claim 1, wherein the portions (17) which border the interior of the vacuum treatment chamber or around the diaphragm arrangement (7, 9), the method including operating the portions at a fixed potential ($\phi_B$, u).

3. A process according to claim 2, including operating the portions (17) as an ignition electrode for the low-voltage discharge at different potentials ($\phi_B$; $\phi_{B-u}$) for igniting and thereafter operating the low-voltage discharge.

4. A process according to claim 3, including connecting the portions (17) to a fixed potential ($\phi_B$) via a unit (28) which generates a voltage as a function of a current (i) flowing through the unit and which is formed by at least one passive switching element across which a portion of the discharge current effects a voltage drop (u) during operation of the low-voltage discharge in such a way that the potential of the portions (17) is subsequently shifted by the ignition potential ($\phi_B$) toward a potential ($\phi_K$) of the cathode.

5. A process according to claim 3, wherein the portions (17) are connected to a fixed potential ($\phi_B$) via a current-controlled voltage source.

6. A process according to claim 1, wherein the portions (17) are electrically insulated (22) from the treatment chamber (11).

7. A process according to claim 1, wherein the portions (17) are formed by a wall of the cathode chamber (1).

8. A process according to claim 1, wherein the portions (17) are operated at a different electrical potential with respect to a potential of a wall of the treatment chamber (11).

9. A process according to claim 1, wherein at least parts of the treatment chamber (11) form the anode of the thermionic cathode for the discharge.

10. A process according to claim 1, wherein the anode comprises a separate electrode (38) in the interior of the vacuum treatment chamber, which acts as a substrate carrier and is connected to a potential which is independent of a potential to which a wall of the vacuum treatment chamber (11) is connected.

11. A process according to claim 1, wherein the cathode chamber and the treatment chamber are operated at different operating pressures and the diaphragm arrangement (7, 9) is used simultaneously as a pressure stage between the cathode chamber and treatment chamber.

12. A process according to claim 11, wherein the diaphragm arrangement (7, 9) is provided with at least one of a cathode chamber-side and treatment chamber-side pipe socket (44) for increasing the pressure stage between the chambers.

13. A process according to claim 11, including at least two said diaphragm arrangements at a distance from one another which each form one pressure stage, the process including suctioning-off gas between the diaphragm arrangements.

14. A process according to claim 1, wherein the diaphragm arrangement has the at least one opening (9) therein, the screen (20) extending into an immediate vicinity around the at least one opening (9) of the diaphragm arrangement (7).

15. A process according to claim 14, including controlling a spatial distribution of the low-voltage discharge by applying a stationary or time-variable magnetic field in the treatment chamber.

16. A process according to claim 15, wherein an influence of a locally varying earth's magnetic field onto orbits of low-voltage discharge electrons in the low-voltage discharge is compensated by means of the magnetic field.

17. A process according to claim 15, wherein the spatial distribution of the low-voltage discharge as well as a plasma density thereof along a region subjected to a treatment with the support of the discharge is controlled by means of the magnetic field.

18. A process according to claim 15, wherein the distribution of the low-voltage discharge as well as a plasma density thereof along a region subjected to a treatment with the support of the discharge are controlled by time and space variations of the magnetic field.

19. A process for igniting and operating a low-voltage discharge in a cathode chamber (1) wherein at least one thermionic cathode (3) is provided in the cathode chamber, the process comprising:

connecting at least parts of an inner wall of the cathode chamber to a fixed potential ($\phi_B$) via a current limitation element (30), between which and a potential ($\phi_K$) connected to the cathode (3), is obtained the ignition voltage.

20. A process according to claim 19, wherein the current limitation element comprises a resistor.

21. A vacuum treatment apparatus comprising:
a treatment chamber (11);
a cathode chamber (1) coupled to the treatment chamber by a diaphragm arrangement (7, 9) with at least one thermionic cathode (3) for generating a low-voltage discharge in the cathode chamber;
a screen (20) operated so as to be electrically floating at the side of the treatment chamber and around the diaphragm arrangement;
the screen being mounted at a dark space distance with respect to wall portions (17) encompassing the diaphragm arrangement (7, 9, 17) and facing the wall portions (17); and
the wall portions bordering the treatment chamber.

22. A vacuum treatment apparatus according to claim 21, wherein at least parts of the portions (17) covered by the screen (20) are at a fixed potential ($\phi_B$).

23. A vacuum treatment apparatus according to claim 22, wherein the portions (17) are connected via a current limitation element (30) or a current-controlled voltage source to a fixed potential ($\phi_B$) which is positive with respect to a potential ($\phi_K$) connected to the thermionic cathode (3).

24. A vacuum treatment apparatus according to claim 23, wherein the potential ($\phi_B$) on the portions (17) without discharge current flow, defines an ignition voltage ($U_Z$) with respect to the potential ($\phi_K$) on the thermionic cathode (3).

25. A vacuum apparatus according to claim 21, wherein at least parts of the portions (17) are mounted so as to be electrically insulated (22) from remaining wall portions (11) facing an interior of the treatment chamber.

26. A vacuum treatment apparatus according to claim 21, wherein the portions (17) are connected to the potential of the treatment chamber wall (11).

27. A vacuum treatment apparatus according to claim 21, wherein a discharge anode in the treatment chamber (11) is formed by a wall of the treatment chamber or by other parts in the treatment chamber.

28. A vacuum treatment apparatus according to claim 21, wherein the portions which are covered by the screen (20) are formed by parts of a wall of the cathode chamber (1).

29. A vacuum treatment apparatus according to claim 21, wherein the screen (20) extends into the direct vicinity of at least one opening (9) in the diaphragm arrangement (7, 9).

30. A vacuum treatment apparatus according to claim 21, wherein the diaphragm arrangement (7, 9) comprises a pressure stage and at least one diaphragm opening (9) continued by means of a pipe socket (44) into the cathode chamber or into the treatment chamber.

31. A vacuum treatment apparatus according to claim 21, including in a direction of discharge from the cathode chamber, at least two diaphragm arrangements maintained at a distance from one another and forming a pressure stage, and means forming a pumping connection between the arrangement.

32. A vacuum treatment apparatus according to claim 21, including at least one gas inlet (40) terminating in the cathode chamber for an ionization gas or a reactive gas.

33. A vacuum treatment apparatus according to claim 21, wherein at least in the treatment chamber gas pumping means are provided.

34. A vaccum treatment apparatus according to claim 21, including at least one gas inlet (40) terminating in the treatment chamber.

35. A vacuum treatment apparatus according to claim 34, wherein the gas inlet is adapted for supplying hydrogen into the treatment chamber.

36. A cathode chamber assembly for a vacuum treatment apparatus, comprising:
walls defining the cathode chamber, at least a portion of said walls forming an ignition electrode for a low-voltage arc discharge in the cathode chamber;
a thermionic cathode (3) in the cathode chamber; and
current limiting means (30) connected between the thermionic cathode and a fixed potential ($\phi_B$) and means for applying a current-less ignition voltage to the portions forming the ignition electrode, with respect to a cathode potential ($\phi_K$) of the cathode chamber.

37. A cathode chamber according to claim 36, wherein the current limiting means comprises a resistor.

38. A cathode chamber according to claim 36, wherein the current limiting means comprises a current-controlled voltage source.

* * * * *